(12) United States Patent
Flowers et al.

(10) Patent No.: US 10,992,146 B2
(45) Date of Patent: Apr. 27, 2021

(54) METHODS AND APPARATUS FOR CONTROLLING CHARGE CURRENT IN A BATTERY PACK CONTAINING CELLS OF DISPARATE TYPES

(71) Applicant: Motorola Solutions, Inc., Chicago, IL (US)

(72) Inventors: Donald L. Flowers, Dacula, GA (US); Ryan Baker, Atlanta, GA (US); Robert L. Snyder, Suwanee, GA (US)

(73) Assignee: Motorola Solutions, Inc., Chicago, IL (US)

( * ) Notice: Subject to any disclaimer, the term of this patent is extended or adjusted under 35 U.S.C. 154(b) by 123 days.

(21) Appl. No.: 16/229,632

(22) Filed: Dec. 21, 2018

(65) Prior Publication Data
US 2020/0203961 A1 Jun. 25, 2020

(51) Int. Cl.
*H02J 7/00* (2006.01)
*H01M 2/10* (2006.01)
*H01M 10/48* (2006.01)
*G01R 19/165* (2006.01)

(52) U.S. Cl.
CPC ......... *H02J 7/0016* (2013.01); *H01M 2/1033* (2013.01); *H01M 10/482* (2013.01); *H02J 7/0026* (2013.01); *H02J 7/00041* (2020.01); *G01R 19/16542* (2013.01); *H02J 2207/20* (2020.01)

(58) Field of Classification Search
CPC ..... Y02E 60/12; H01M 2/1055; H01M 10/46; H01M 10/425; H02J 7/0045
See application file for complete search history.

(56) References Cited

U.S. PATENT DOCUMENTS

| 4,238,721 A | 12/1980 | DeLuca et al. |
|---|---|---|
| 8,339,100 B2 | 12/2012 | Li et al. |
| 2007/0247107 A1 | 10/2007 | Wang et al. |
| 2009/0108804 A1* | 4/2009 | Aradachi ............ H02J 7/00038 320/106 |
| 2011/0248681 A1 | 10/2011 | Miller et al. |

(Continued)

FOREIGN PATENT DOCUMENTS

GB 2501751 11/2013

OTHER PUBLICATIONS

International Search Report and Written Opinion for PCT Patent Application No. PCT/US2019/066005, dated Mar. 4, 2020.

*Primary Examiner* — Arun C Williams
(74) *Attorney, Agent, or Firm* — Baker Botts L.L.P.

(57) ABSTRACT

Methods and apparatus for controlling charge current in a battery pack containing cells of disparate types are disclosed. The methods include receiving a charge current for charging a battery pack that includes one or more battery cells of a first cell type, and one or more battery cells of a second cell type. Each battery cell of the first cell type has a first impedance and a first charge current limit. Each battery cell of the second cell type has a second impedance greater than the first impedance and a second charge current limit greater than the first charge current limit. The methods include reducing, by a respective current control circuit associated with each battery cell of the first cell type, the amount of the received charge current through the battery cell of the first cell type to an amount less than the first charge current limit.

20 Claims, 9 Drawing Sheets

(56) References Cited

U.S. PATENT DOCUMENTS

2015/0084639 A1* 3/2015 Joe .......................... B60L 58/12
    324/428
2015/0155602 A1* 6/2015 Hwang ............. H01M 10/4207
    429/50

* cited by examiner

METHODS AND APPARATUS FOR CONTROLLING CHARGE CURRENT IN A BATTERY PACK CONTAINING CELLS OF DISPARATE TYPES

BACKGROUND OF THE INVENTION

Feature rich portable electronic devices, including portable communication devices, require ever increasing amounts of energy from batteries in terms of higher peak load currents and higher average load currents. For example, radios have evolved from simple analog devices with peak transmission power demands to multifunction computing systems in which different software-controlled modes have different peak current demands. The radio may be restricted in terms of power consumption or current consumption to satisfy compliance with one or more safety standards, including Appareils destines a etre utilises en ATmospheres EXplosibles (ATEX), Underwriters Laboratories (UL), and International Electrotechnical Commission System for Certification to Standards Relating to Equipment for Use in Explosive Atmospheres (IECEx), or to avoid damaging the battery or the radio due to over-charge, over-discharge, or over-current conditions.

Battery packs for powering portable electronic devices may include multiple battery cells selected based on their physical size and energy capacity. For example, space constraints may restrict the types of battery cells included in a battery pack. In addition, performance requirements under particular environmental conditions may reduce the number of suitable battery cell chemistries. Typically, the battery cells in a battery pack are identical battery cells that work together as if they are a single large battery cell.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention and explain various principles and advantages of those embodiments.

Figure 1:
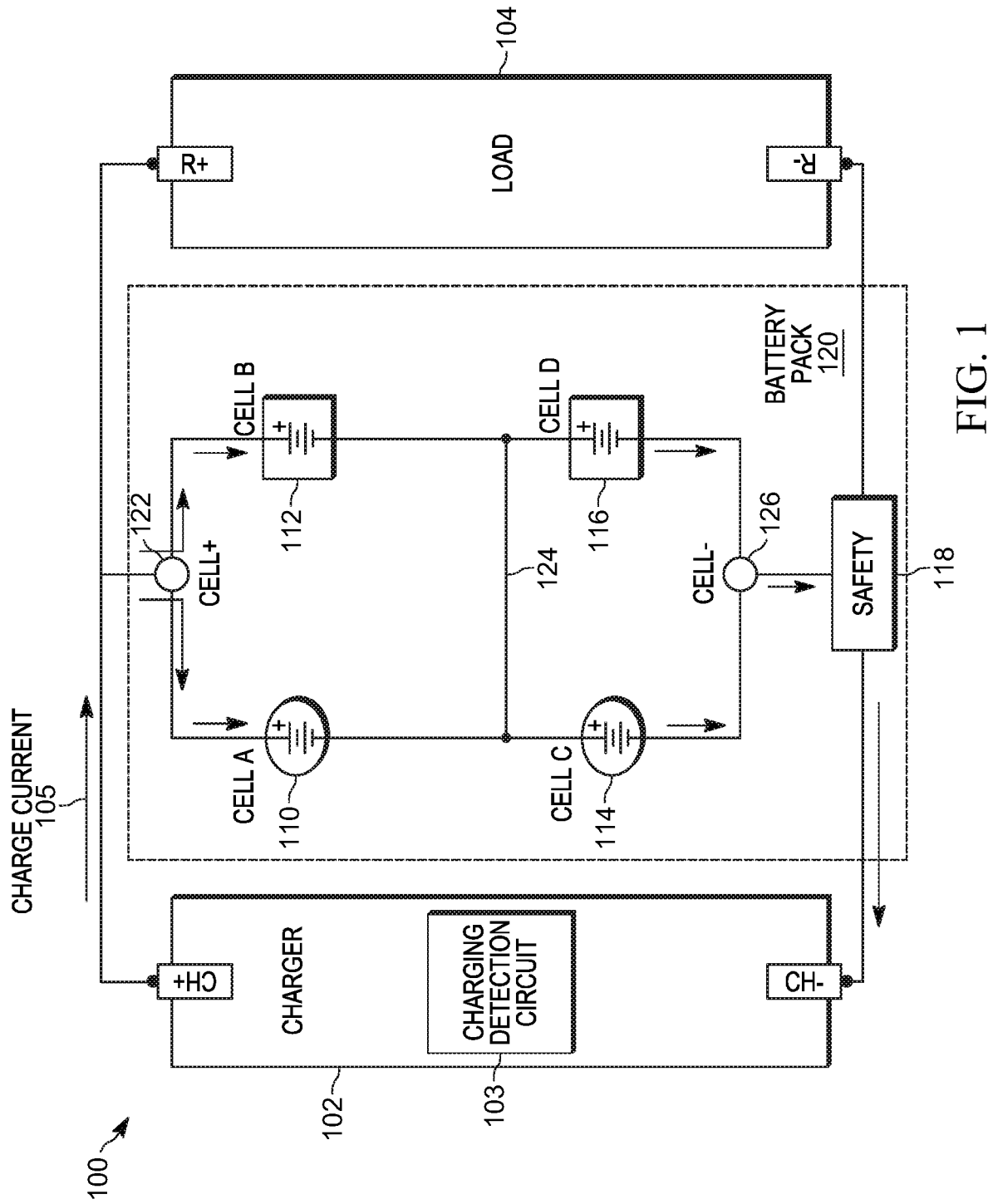
FIG. 1 is a block diagram illustrating selected elements of an example battery pack for an electronic device containing cells of disparate types, in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by suitable symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Disclosed herein are methods and apparatus for controlling charge current in a battery pack containing cells of disparate types. In one embodiment, a disclosed battery pack for an electronic device includes one or more battery cells of a first cell type electrically connected between positive and negative terminals of the battery pack, each battery cell of the first cell type having a first impedance and a first charge current limit, one or more battery cells of a second cell type electrically connected between the positive and negative terminals of the battery pack in parallel with the one or more battery cells of the first cell type, each battery cell of the second cell type having a second impedance greater than the first impedance and a second charge current limit greater than the first charge current limit, and a respective current control circuit electrically connected in series with each of the one or more battery cells of the first cell type and configured to reduce a charge current through the battery cell of the first cell type below the first charge current limit.

In one embodiment, a disclosed method for controlling charge current in a battery pack includes receiving, during an operation to charge the battery pack, a charge current for charging a plurality of battery cells in the battery pack. The plurality of battery cells includes one or more battery cells of a first cell type, each battery cell of the first cell type having a first impedance and a first charge current limit, and one or more battery cells of a second cell type, each battery cell of the second cell type having a second impedance greater than the first impedance and a second charge current limit greater than the first charge current limit. The method further includes reducing, by a respective current control circuit associated with each of the battery cells of the first cell type, the amount of the received charge current through the battery cell of the first cell type to an amount less than the first charge current limit.

In one embodiment, a disclosed portable electronic device includes a battery pack and one or more electrical circuits powered by the battery pack. The battery pack includes one or more battery cells of a first cell type electrically connected between positive and negative terminals of the battery pack, each battery cell of the first cell type having a first impedance and a first charge current limit, one or more battery cells of a second cell type electrically connected between the positive and negative terminals of the battery pack in parallel with the one or more battery cells of the first cell type, each battery cell of the second cell type having a second impedance greater than the first impedance and a second charge current limit greater than the first charge current limit, and a respective current control circuit electrically connected in series with each of the one or more battery cells of the first cell type and configured to reduce a charge current through the battery cell of the first cell type below the first charge current limit.

In at least some embodiments, the battery cells of the first cell type and the battery cells of the second cell type may have substantially similar charge voltages. The battery cells of the first cell type may have a different shape or size than the battery cells of the second cell type. The battery cells of the first cell type may have a greater energy capacity than the energy capacity of the battery cells of the second cell type.

In various embodiments, the respective current control circuit electrically connected in series with each of the battery cells of the first cell type may include a resistive element to remove energy from the system in a non-recoverable way. In some embodiments, a current control circuit may include a resistor, a direct-current-to-direct-current (DC/DC) regulator or DC/DC converter, or an active current limiting device configured to receive feedback from a respective current sensing apparatus. In other embodiments, energy may be removed from the system using heat, electric fields, magnetic fields, or other energy-lossy transformations. In at least some embodiments, the battery pack may further include a respective bypass circuit electrically connected in parallel with each of the current control circuits and configured to disable the current control circuit during battery discharge cycles.

Battery packs including multiple cells of disparate cell types may be desirable for optimal space integration with portable electronic devices. In some embodiments of the battery packs described herein, battery cells of different shapes, sizes, energy capacities, and impedances may be arranged in various series and parallel configurations to take advantage of the performance characteristics of each different cell type. However, the use of different types of battery cells, such as different types of lithium-ion (Li-Ion) cells, can result in large impedance mismatches between the battery cells in some cell pack configurations. Such impedance mismatches can negatively affect charge times, battery cell cycle life, and other battery cell performance metrics in embodiments in which the charge current must be limited for battery cells within the battery pack having lower impedance than other battery cells within the battery pack. It can be challenging to design and implement a battery pack for portable electronic devices, such as radios, that include a mix of battery cells of different cell types connected together to achieve desired performance goals.

In at least some embodiments, the battery cells of each different cell type may require different charge currents. However, they may all have similar voltage characteristics. For example, all of the battery cells within a battery pack may charge to the same, or a similar, voltage level regardless of differences in their shapes, sizes, energy capacities, or impedances. This may be true whether or not the battery cells are implemented using the same battery chemistries. For example, a prismatic battery cell implemented using a solid-state type lithium-ion compound and a cylindrical battery cell implemented using an electrolyte type lithium-ion compound may have similar voltage profiles.

Referring now to FIG. 1, there is provided a block diagram illustrating selected elements of an example battery pack for an electronic device containing battery cells of disparate types, in accordance with some embodiments. In the illustrated example, a battery circuit 100 includes a charger 102, a load 104, and a rechargeable battery pack 120. Battery pack 120 contains four lithium-ion battery cells of two cell types in a parallel configuration. More specifically, battery pack 120 includes two cells of a cylindrical cell type, shown as battery cells A (110) and C (114), in parallel with two cells of a prismatic cell type, shown as battery cells B (112) and D (116). In this example, in which the battery cells of one cell type are in series with each other and then in parallel with the battery cells of the other type, the battery topology may be referred to as two-series-two-parallel, or 2S2P.

In the illustrated example, the voltage at the positive terminal of battery pack 120 (shown as cell+ 122) may be in the range of 6.0 to 8.4 VDC, while the voltage at a middle terminal of battery pack 120 (shown as cell mid 124) may be in the range of 3.0 to 4.2 VDC. Battery pack 120 also includes a safety circuit 118.

In the illustrated example, a positive terminal CH+ of the charger 102 is connected to a positive terminal Cell+ (122) of the battery pack 120 and a positive terminal R+ of the load 104. Similarly, a negative terminal CH− of the charger 102 is connected to a negative terminal Cell− (126) of the battery pack 120 and a negative terminal R− of the load 104. The path between the terminals (CH+ and CH−) of the charger 102 and the terminals (Cell+ 122 and Cell− 126) of the battery pack 120 defines a charge path of the battery circuit 100. The charger 102 charges the battery pack 120.

In some embodiments, the battery circuit 100 is provided in a housing of an electronic device and the charger 102 is external to the housing of the electronic device. The positive terminal CH+ and the negative terminal CH− of the charger 102 are electrically connected to the battery circuit 100 when the charger is plugged into the electronic device. In other embodiments, the charger 102 may be located in the housing of the electronic device. In still other embodiments, the battery pack 120 and the battery circuit 100 are located outside the housing of the electronic device such as in a separate housing. In some embodiments, charger 102 may include a detection circuit 103 configured to detect when battery pack 120 is being charged.

The battery pack 120 provides electrical power for operation of the load 104. For example, the load 104 may include circuit components of an electronic device, such as a microprocessor, memories, amplifiers, communication circuits and the like. The electronic device may be a multifunction radio, a mobile telephone, a laptop computer, a tablet computer, a smart phone, a lighting system, a sound system, or another type of portable electronic device, in different embodiments. The positive terminal Cell+ (122) of the battery pack 120 is connected to the positive terminal R+ of the load 104 and the negative terminal Cell− (126) of the battery pack 120 is connected to the negative terminal R− of the load 104. The path between the terminals (Cell+ 122 and Cell− 126) of the battery pack 120 and the terminals (R+ and R−) of the load 104 defines a load path of the battery circuit 100. In certain embodiments, the load 104 also receives electrical power from the charger 102 when the battery pack 120 is charging.

During an operation to charge battery pack 120, a charge current 105 (shown by the arrows in FIG. 1) flows along the charge path of the battery circuit 100 from charger 102 to the positive terminal (cell+ 122) of battery pack 120, then through battery cells A (110) and C (114) on the left branch and battery cells B (112) and D (116) on the right branch to the negative terminal (cell− 126) of battery pack 120.

In the illustrated embodiment, battery cell A (110) is a cylindrical battery cell having an impedance of 25 mΩ and a charge current limit of 2.1 amps. The capacity of battery cell A (110) may be twice the capacity of battery cell B (112). Battery cell B (112) is a prismatic cell having an impedance of 80 mΩ and a charge current limit on the order of 3 or 4 amps. The capacity of battery cell B (112) may be half the capacity of battery cell A (110). Like battery cell A (110), battery cell C (114) is a cylindrical battery cell having an impedance of 25 mΩ and a charge current limit of 2.1 amps. The capacity of battery cell C (114) may be equal to the capacity of battery cell A (110) and may be twice the capacity of battery cell D (116). Like battery cell B (112), battery cell D (116) is a prismatic cell having an impedance of 80 mΩ and a charge current limit on the order of 3 or 4 amps. The capacity of battery cell D (116) may be equal to the capacity of battery cell B (112) and may be half the capacity of battery cell C (114).

In the illustrated example, the particular battery cells within battery pack 120 may be selected based on size constraints and the energy capacity for batteries of each battery cell type, among other criteria. For example, the smaller prismatic battery cells B (112) and D (116) have higher impedance and a lower energy capacity than the larger cylindrical battery cells A (110) and C (114). However, the performance characteristics of prismatic battery cells B (112) and D (116) in the face of certain environmental conditions, such as their ability to provide current at low temperatures, are superior to those of the cylindrical battery cells A (110) and C (114). In one example, for an electronic device with a requirement to operate at very low temperatures, such as down to −20° C., the performance of cylindrical battery cells A (110) and C (114) may be insufficient. On the other hand, the prismatic battery cells B (112) and D (116) may be designed to operate well at those temperatures, or at even lower temperatures. Therefore, unlike cylindrical battery cells A (110) and C (114), at very low temperatures, the prismatic battery cells B (112) and D (116) may provide energy capacity that is relatively stable. Combining both cylindrical battery cells A (110) and C (114) and prismatic battery cells B (112) and D (116) within battery pack 120 may result in a better-performing battery at cold temperatures than would be possible with a battery pack containing only cylindrical battery cells. The cylindrical battery cells A (110) and C (114) provide twice the energy capacity of the prismatic battery cells B (112) and D (116) at higher temperatures. The resulting battery pack 120 is a high capacity battery whose performance at warmer temperatures is superior to a battery pack with only prismatic battery cells, but that provides a stable energy source for the load 104 at very low temperatures.

In some embodiments, safety circuit 118 monitors electrical parameters of the battery pack 120. For example, the safety circuit 118 may monitor, among other things, a voltage across the battery pack 120 and a current flowing through the battery pack 120 during charging or discharging. In at least some embodiments, the safety circuit 118 may be connected to the positive terminal (cell+ 122), the negative terminal (cell− 126), and the middle terminal (cell mid 124) of the battery pack 120. In some embodiments, safety circuit 120 may use a sense resistor to monitor the current and voltage conditions of the battery pack 120. The safety circuit 118 may be implemented, for example, using available integrated circuits, such as the S-8252 battery protection integrated circuit available from Seiko Instruments Inc. The battery protection integrated circuit may include one or more of a discharge over-current protection function and a fast short circuit protection function. In response to detecting a discharge over-current condition or a short circuit condition, safety circuit 118 may disable battery pack 120. In some embodiments, prior to disabling battery pack 120, safety circuit 118 may output a signal to load 104 indicating that battery pack 120 will be disabled in the near future (not shown).

In the illustrated example, in order to meet fast charge time requirements for the electronic devices powered by battery pack 120, the overall charge current into the battery must be optimized. In at least some embodiments, this may be achieved by employing a method of controlling the amount of the charge current into the battery cells of each cell type so that the maximum charge current for the cell type is not exceeded. In one example in which battery pack 120 is used to power a portable electronic communication device, such as a radio, in order to meet the charge time requirements of the radio, the charge rate for battery pack 120 should be 2.9 amps. Absent the current control techniques described herein, the charge current for battery pack 120 may be limited to 2.3 amps, rather than 2.9 amps, due to the charge current limitation of the cylindrical cells (which should not exceed 2.1 amps).

Figure 2:
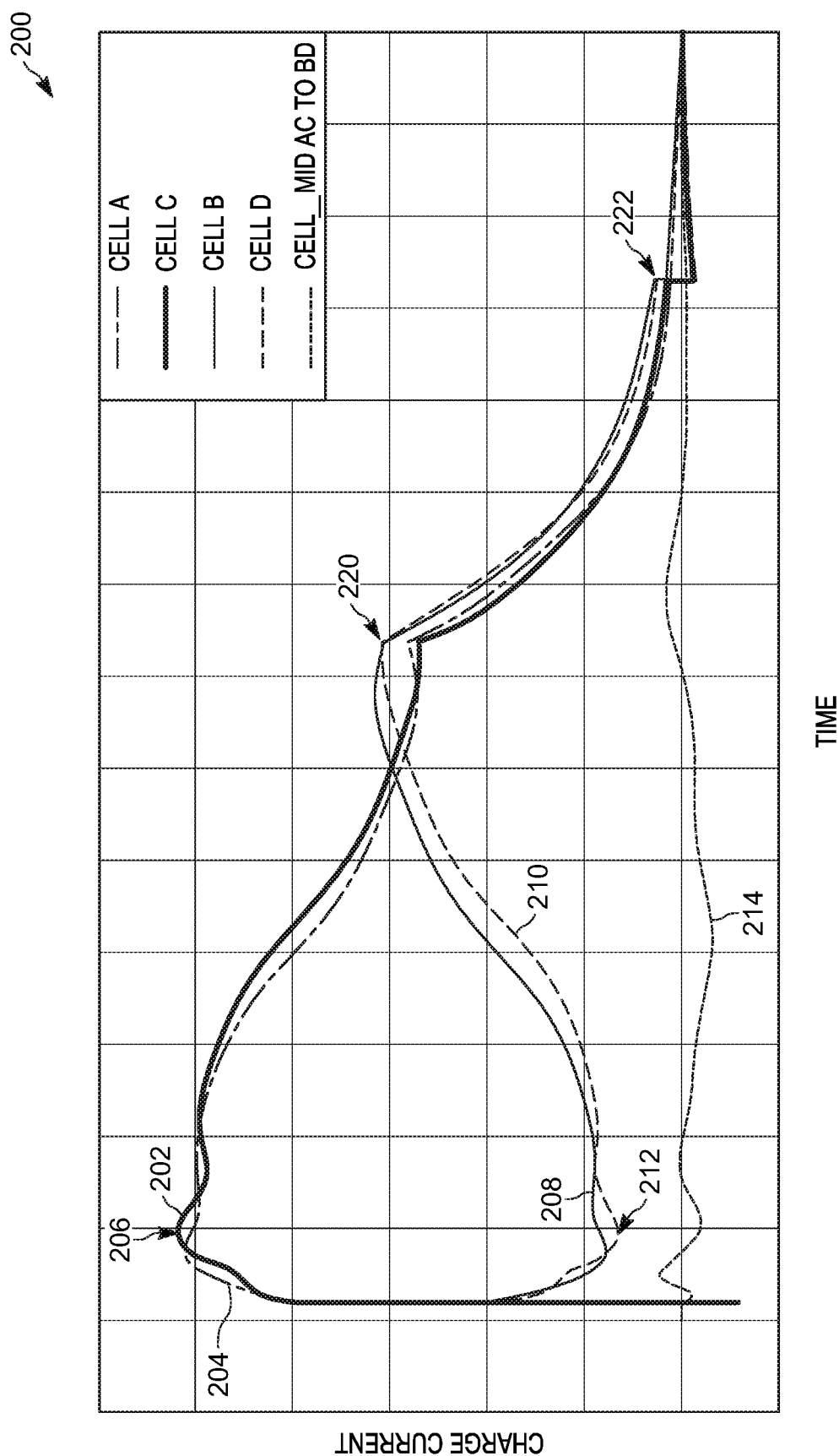
FIG. 2 is chart illustrating charge currents over time for an unbalanced battery pack containing cells of disparate types.

In the example battery circuit illustrated in FIG. 1, if no current control mechanisms are used, the initial fast charge rate in the larger capacity low impedance cylindrical battery cells A (110) and C (114) would be over seven times that of the charge rate for the smaller capacity prismatic battery cells B (112) and D (116). FIG. 2 depicts test data in a chart 200 illustrating example charge currents over time for an unbalanced battery pack containing cells of disparate types. More specifically, chart 200 depicts test data illustrating how an impedance imbalance affects peak charge current in the cylindrical battery cells A (110) and C (114) of battery pack 120 illustrated in FIG. 1. In this example, battery pack 120 was charged at 2.9 amps and there were 10Ω sense resistors between the battery cells. Chart 200 depicts charge currents over time on a grid in which the space between pairs of vertical grid lines represents an interval of fifteen minutes.

As noted above, battery cells A (110) and C (114) each have a charge current limit of 2.1 amps. In this example, because cylindrical battery cells A (110) and C (114) have lower impedance than battery cells B (112) and D (116), the charge current in battery cell A (shown as charge current 204) and the charge current in battery cell C (shown as charge current 202), whose peaks are measured as 2.55 amps and 2.58 amps respectively, far exceeded the charge current limit of 2.1 amps for these cells when the battery pack 120 was charged at 2.9 amps. The point of peak charge current for the two cylindrical battery cells of approximately 2.58 amps is labeled as point 206 for battery cell C (114).

In this example, prismatic battery cells B (112) and D (116) have higher impedance than battery cells A (110) and C (114). The charge current in battery cell B (shown as charge current 208) and the charge current in battery cell D (shown as charge current 210) did not exceed the charge current limit for these cells when the battery pack 120 was charged at 2.9 amps. In fact, until battery cells A (110) and C (114) have reached the crossover point 220 at which the target maximum voltage for all battery cells has been reached, very little of the received charge current is directed to charge battery cells B (112) and D (116). The point of minimum charge current for the two prismatic battery cells of approximately 0.33 amps is labeled as point 212 for battery cell D (210). In this example, the charge current at the middle terminal (cell mid 124) of the battery pack 120 between battery cells A (110) and C (114) and battery cells B (112) and D (116) is shown in chart 200 as charge current 214. The point labeled as 222 is sometimes referred to as the "cutoff point." At this point, charging of the battery pack, and all of the battery cells thereof, ceases.

Without any current control mechanisms employed, the overall charge rate of the battery pack will be limited by the charge characteristics of the cylindrical battery cells A (110) and C (114) and will result in longer charge times for the battery pack 120 than if current control mechanisms, such as those described herein, are employed. The current control mechanisms described herein introduce impedance into the circuits for the cylindrical cells to limit their current during charging. In at least some embodiments, this approach allows charging of the battery pack 120 to take place at a higher rate. In addition, this approach may avoid imbalances between the first level and second level voltages of the battery cells of the same cell type. For example, without added impedance, instabilities were observed in the charging of individual ones of the battery cells, leading to oscillations during charging.

In some cases, when the impedances of battery cells of disparate cell types in a battery pack are unbalanced, this may result in the battery cells getting so far out of balance in terms of voltage that this condition may trigger the safety circuit 118 to stop the charging operation or to disable the battery pack 120.

Figure 4:
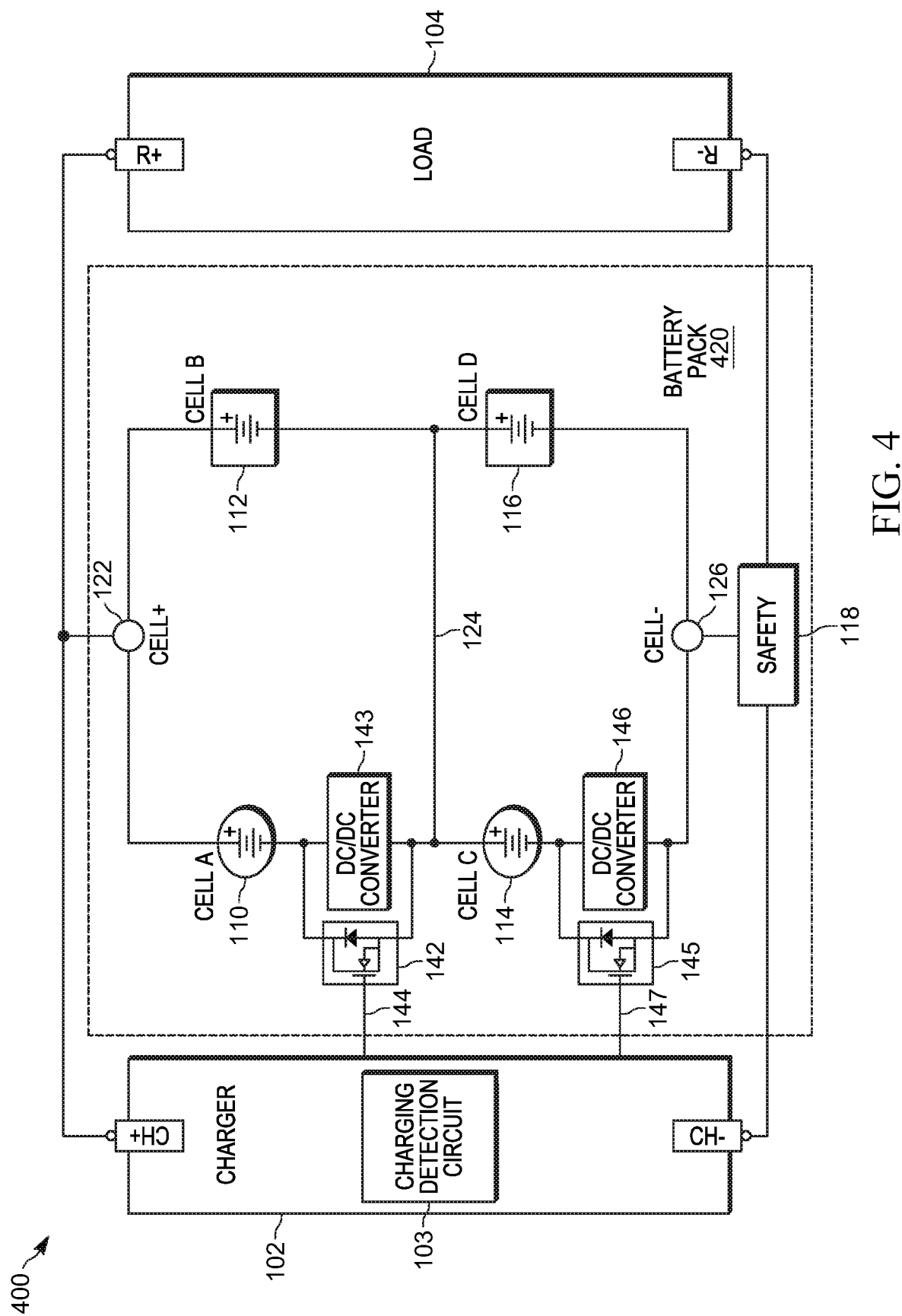
FIG. 4 is a block diagram illustrating selected elements of an example battery pack for an electronic device in which buck regulators are added in series with cells of a first cell type, in accordance with some embodiments.
Figure 5:
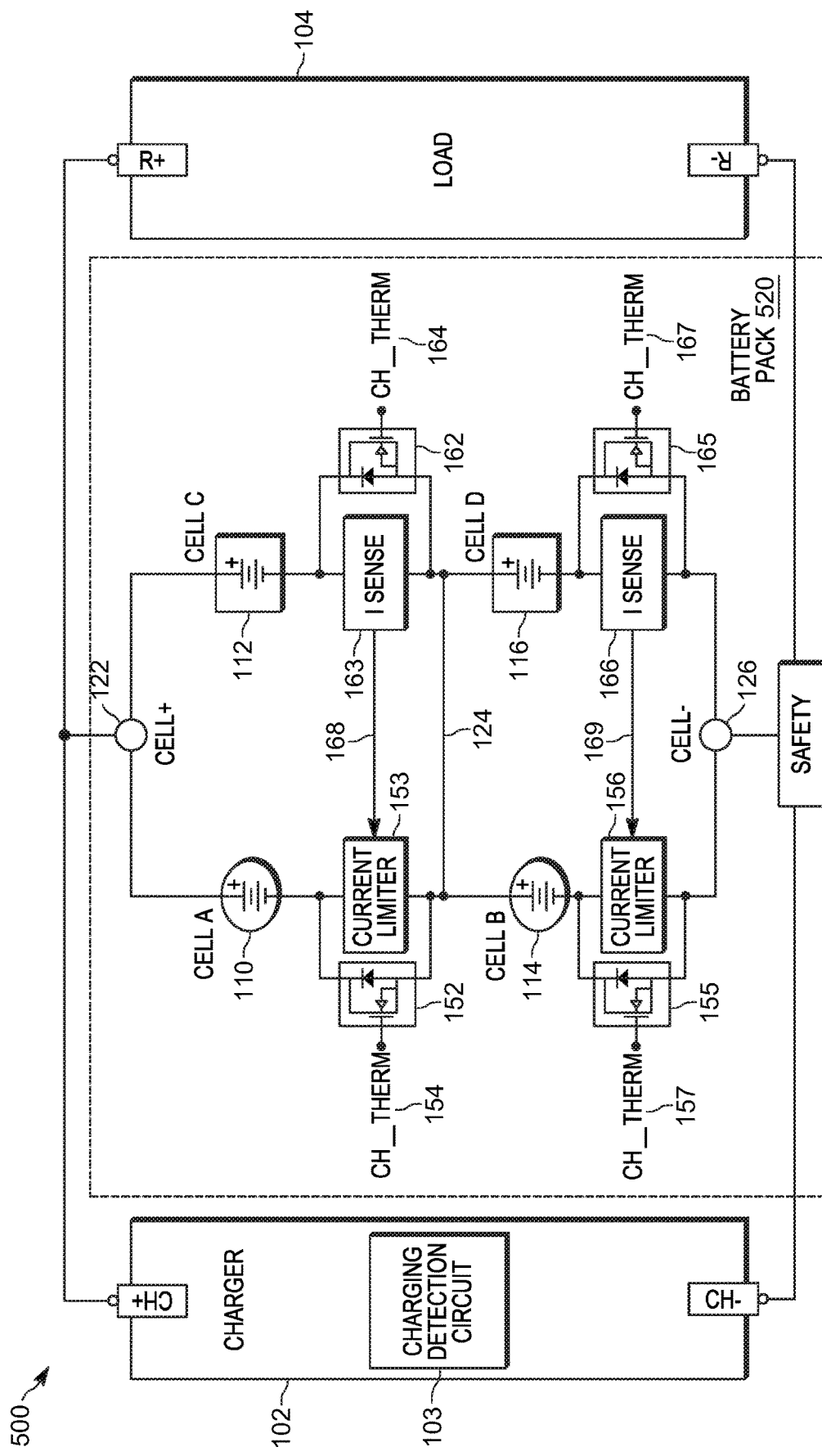
FIG. 5 is a block diagram illustrating selected elements of an example battery pack for an electronic device in which active current limiting circuits are added in series with cells of a first cell type, in accordance with some embodiments.

In various embodiments, the methods described herein for controlling the charge current into different types of battery cells include enabling a respective current control mechanism on each of the lower impedance battery cells of a battery pack during charging and disabling these current control mechanisms during discharging into the load. The current control mechanisms may use any of a variety of mechanisms to add impedance in series with each of the lower impedance battery cells including, but not limited to, those described herein. Three example embodiments are illustrated in FIGS. 3-5 and described in detail below.

Figure 3:
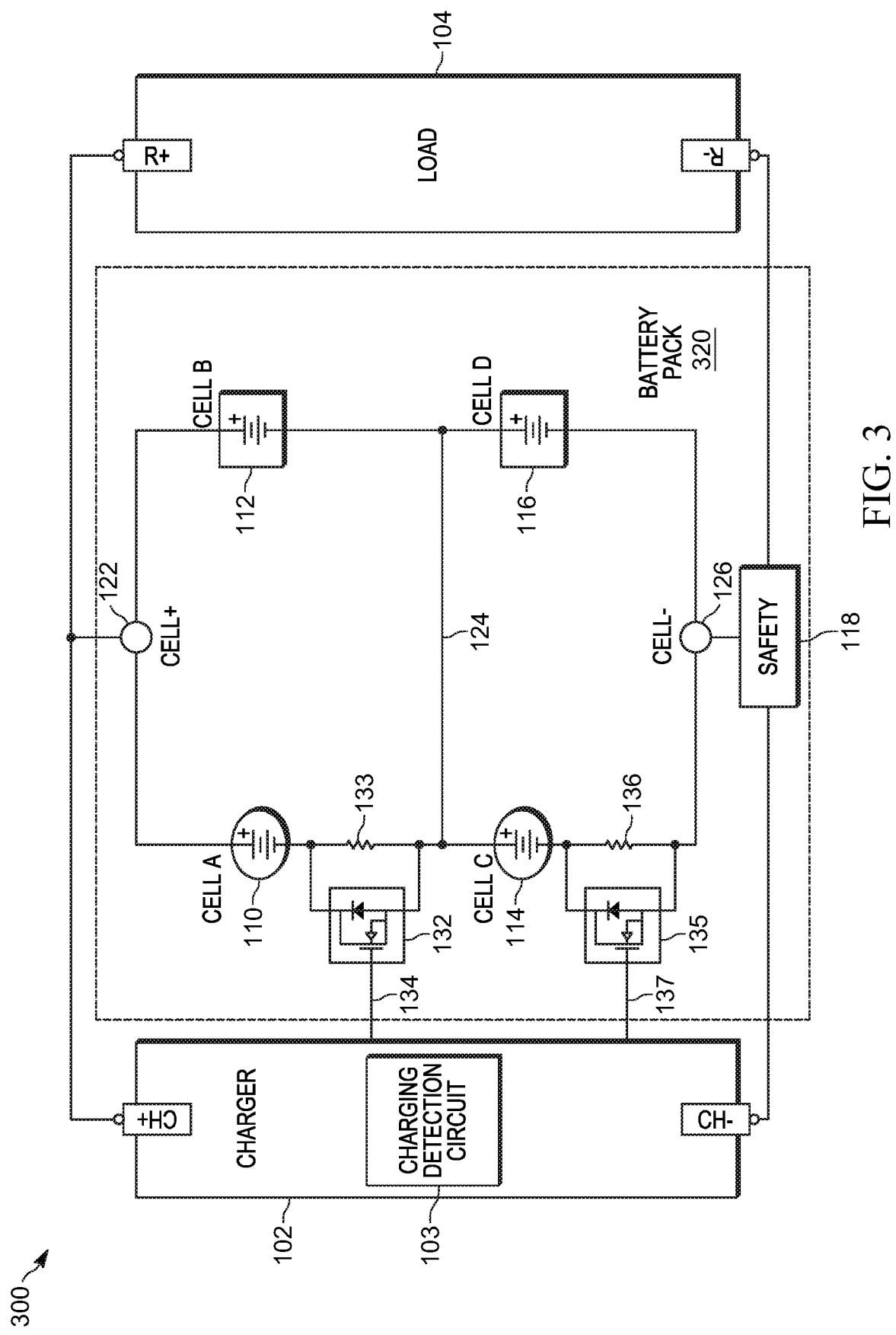
FIG. 3 is a block diagram illustrating selected elements of an example battery pack for an electronic device in which a fixed resistance is added in series with cells of a first cell type, in accordance with some embodiments.

Referring now to FIG. 3, there is provided a block diagram illustrating selected elements of an example battery pack for an electronic device in which a resistive element, in this case a fixed resistance, is added in series with battery cells of a first cell type to better balance the charging of the battery cells of the first cell type in the battery pack and battery cells of a second cell type in the battery pack having a higher impedance than the battery cells of the first cell type, in accordance with some embodiments. In the illustrated example, a battery circuit 300 includes a charger 102, a load 104, and a rechargeable battery pack 320. Charger 102 and load 104 may be similar to charger 102 and load 104 illustrated in FIG. 1. Like battery pack 120 illustrated in FIG. 1, battery pack 320 contains four lithium-ion battery cells of two cell types in a parallel configuration, including two battery cells of a cylindrical cell type, shown as battery cells A (110) and C (114), in parallel with two battery cells of a prismatic cell type, shown as battery cells B (112) and D (116).

In addition to elements that are similar to those of battery circuit 100 illustrated in FIG. 1, battery circuit 300 includes a respective current control circuit in series with each of the cylindrical battery cells A (110) and C (114). In the illustrated example, each current control circuit includes a fixed resistance that is added in series with a respective one of the cylindrical battery cells A (110) and C (114) within battery pack 320. More specifically, a resistor 133 having a fixed resistance of 55 mΩ is added in series with battery cell A (110) and a resistor 136 having a fixed resistance of 55 mΩ is added in series with battery cell C (114). In at least some embodiments, the amount of the fixed resistance may be selected based on the target peak charge current for the cylindrical battery cells A (110) and C (114). Battery pack 320 also includes a respective bypass circuit electrically coupled to each of the current control circuits that, during discharge operations, is enabled to bypass the current control circuit. For example, in the illustrated embodiment, a bypass circuit 132 is electrically coupled in parallel with resistor 133 and a bypass circuit 135 is electrically coupled in parallel with resistor 136. In some embodiments, each of the bypass circuits 132 and 135 includes a very low impedance MOSFET that, when enabled by the assertion of a respective control signal 134 or 137, is configured to short across a respective one of the resistors 133 or 136, removing the resistance due to the resistors 133 or 136. In some embodiments, each of the control signals 134 and 137 may represent a control signal received from charger 102 indicating whether or not a charging operation is in progress. In other words, the respective control signals 134 and 137 may be asserted or de-asserted to enable or disable the current control circuit dependent on whether the battery cells within battery pack 120 are being charged or are discharging. As in the example illustrated in FIG. 1, in some embodiments, charger 102 may include a detection circuit 103 configured to detect when battery pack 120 is being charged and may assert or de-assert control signals 134 and 137 accordingly. In other embodiments, each of the control signals 134 and 137 may represent a battery thermistor signal received from charger 102.

As previously noted, current control circuits added in series with battery cells of a first cell type to better balance the charging of disparate battery cells in a battery pack may include DC/DC regulators or DC/DC converters. The current control circuits may, for example, implement switch-mode power techniques and may include an energy storage element, such as an inductor, and feedback compensation, where necessary. In various embodiments, the current control circuits may include any suitable type of DC/DC regulators or DC/DC converters, or more broadly any variety of DC/DC step-down converters including, but not limited to, low dropout (LDO) regulators, flyback DC/DC converters, buck converters, buck regulators, buck regulator chargers, battery eliminator circuit (BEC) converters, single-ended primary-inductor converters (SEPIC), split-pi converters, charge pumps, or other apparatus, some of which may be included in the body of a switch-mode power supply. In one embodiment, the current control circuits may be implemented using an available integrated circuit, such as the BQ25601 synchronous switch-mode buck charger integrated circuit available from Texas Instruments Incorporated. This single cell buck regulator charger provides 92% efficiency from higher input voltages and charges a battery cell to a fixed voltage set point (4.2V) for a single cell while providing the maximum current in accordance with the applicable current limit. In some embodiments, when this integrated circuit is used as a current control circuit added in series with battery cells of a first cell type to better balance the charging of disparate battery cells in a battery pack, the battery pack may be designed to operate without the use of the USB, host, and thermistor interfaces of the integrated circuit and at a point at which Vin is close to Vout.

Referring now to FIG. 4, there is provided a block diagram illustrating selected elements of an example battery pack for an electronic device in which buck regulators are added in series with battery cells of a first cell type to better balance the charging of the battery cells of the first cell type in the battery pack and battery cells of a second cell type in the battery pack having a higher impedance than the battery cells of the first cell type, in accordance with some embodiments. In the illustrated example, a battery circuit 400 includes a charger 102, a load 104, and a rechargeable battery pack 420. Charger 102 and load 104 may be similar to charger 102 and load 104 illustrated in FIG. 1. Like battery pack 120 illustrated in FIG. 1, battery pack 420 contains four lithium-ion battery cells of two cell types in a parallel configuration, including two battery cells of a cylindrical cell type, shown as battery cells A (110) and C (114), in parallel with two battery cells of a prismatic cell type, shown as battery cells B (112) and D (116).

As shown in FIG. 4, in addition to elements that are similar to those of battery circuit 100 illustrated in FIG. 1, battery circuit 400 includes a respective current control circuit in series with each of the cylindrical battery cells A (110) and C (114). In the illustrated example, each current control circuit includes a buck regulator, such as a buck DC/DC converter or a buck regulator charger, that is added in series with a respective one of the cylindrical battery cells A (110) and C (114) within battery pack 420. More specifically, a buck regulator 143 with configurable current and voltage set points is added in series with battery cell A (110) and a buck regulator 146 with configurable current and voltage set points is added in series with battery cell C (114). In this example, the current and voltage set points for the buck regulators 143 and 146 may be selected such that the charge current does not exceed the charge current limit for the cylindrical battery cells A (110) and C (114).

Battery pack 420 also includes a respective bypass circuit electrically coupled to each of the current control circuits that, during discharge operations, is enabled to bypass the current control circuit. For example, in the illustrated embodiment, a bypass circuit 142 is electrically coupled in parallel with buck regulator 143 and a bypass circuit 145 is electrically coupled in parallel buck regulator 146. In some embodiments, each of the bypass circuits 142 and 146 includes a very low impedance MOSFET that, when enabled by the assertion of a respective control signal 144 or 147, is configured to short across a respective one of the buck regulators 143 or 146. In some embodiments, each of the control signals 144 and 147 may represent a control signal received from charger 102 indicating whether or not a charging operation is in progress. In other words, the respective control signals 144 and 147 may be asserted or de-asserted to enable or disable the current control circuit dependent on whether the battery cells within battery pack 120 are being charged or are discharging. As in the example illustrated in FIG. 1, in some embodiments, charger 102 may include a detection circuit 103 configured to detect when battery pack 120 is being charged and may assert or de-assert control signals 144 and 147 accordingly. In other embodiments, each of the control signals 144 and 147 may represent a battery thermistor signal received from charger 102.

In at least some embodiments, buck regulators 143 and 146 may implement a foldback feature for taper charging. In such embodiments, during a charging operation, a foldback voltage control will prevent the charge current from raise the voltage above the termination charge voltage.

As previously noted, current control circuits added in series with battery cells of a first cell type to better balance the charging of disparate battery cells in a battery pack may include active current limiting devices configured to receive feedback from respective current sensing apparatus. In various embodiments, the current control circuits may include any suitable type of active current limiting devices including, but not limited to, an LDO regulator. In one embodiment, the current control circuits may be implemented using an available integrated circuit, such as the TPS25940x current limiting integrated circuit available from Texas Instruments Incorporated. This current limiting integrated circuit, which supports an adjustable current limit in the range of 0.6 amps to 5.3 amps, turns on when Vin is 10 mV higher than Vout, limits the current provided by folding back Vout voltage, and blocks back current if Vout is greater than Vin. In various embodiments, the active current limiting devices may receive feedback from any suitable type of current sensing apparatus including, but not limited to, current sensing resistors, hall effect sensors, or other sensing apparatus.

Referring now to FIG. 5, there is provided a block diagram illustrating selected elements of an example battery pack for an electronic device in which active current limiting circuits are added in series with battery cells of a first cell type to better balance the charging of the battery cells of the first cell type in the battery pack and battery cells of a second cell type in the battery pack having a higher impedance than the battery cells of the first cell type, in accordance with some embodiments. In the illustrated example, a battery circuit 500 includes a charger 102, a load 104, and a rechargeable battery pack 520. Charger 102 and load 104 may be similar to charger 102 and load 104 illustrated in FIG. 1. Like battery pack 120 illustrated in FIG. 1, battery pack 520 contains four lithium-ion battery cells of two cell types in a parallel configuration, including two battery cells of a cylindrical cell type, shown as battery cells A (110) and C (114), in parallel with two battery cells of a prismatic cell type, shown as battery cells B (112) and D (116).

As shown in FIG. 5, in addition to elements that are similar to those of battery circuit 100 illustrated in FIG. 1, battery circuit 500 includes a respective current control circuit in series with each of the cylindrical battery cells A (110) and C (114). In the illustrated embodiment, the charge current through cylindrical battery cells A (110) and C (114) is controlled using an active compensation circuit that includes a feedback loop from a sense resistor and a current limiting device for each battery cell. In the illustrated example, each current control circuit includes an active compensation circuit, such as an active current limiting circuit, that is added in series with a respective one of the cylindrical battery cells A (110) and C (114) within battery pack 420. More specifically, an active current limiting circuit 153 is added in series with battery cell A (110) and an active current limiting circuit 156 is added in series with battery cell B (112). In at least some embodiments, a control mechanism for the active current limiting circuits may enforce particular current and voltage set points, compensating for varying impedance during the charge cycle and allowing the current flow to each battery cell to be maximized. Battery pack 520 also includes a respective current sensing circuit, such as a current sensing resistor, that is added in series with each of the prismatic battery cells C (114) and D (116) within battery pack 420. For example, current sensing circuit 163 is added in series with battery cell C (114) and current sensing circuit 166 is added in series with battery cell D (116). In the illustrated example, active current limiting circuit 153, which is associated with battery cell A (110) is configured to receive feedback 168 from current sensing circuit 163, which is associated with battery cell C (114), and active current limiting circuit 156, which is associated with battery cell B (112) is configured to receive feedback 169 from current sensing circuit 166, which is associated with battery cell D (116).

As illustrated in FIG. 5, battery pack 520 also includes a respective bypass circuit electrically coupled to each of the current control circuits that, during discharge operations, is enabled to bypass the current control circuit. In addition, battery pack 520 includes a respective bypass circuit electrically coupled to each of the current sensing circuits that, during discharge operations, is enabled to bypass the current sensing circuit. For example, in the illustrated embodiment, a bypass circuit 152 is electrically coupled in parallel with active current limiting circuit 153, a bypass circuit 155 is electrically coupled in parallel with active current limiting circuit 156, a bypass circuit 162 is electrically coupled in parallel with current sensing circuit 163, and a bypass circuit 165 is electrically coupled in parallel with current sensing circuit 166. In some embodiments, each of the bypass circuits 152, 155, 162, and 165 includes a very low impedance MOSFET that, when enabled by the assertion of a respective control signal 154, 157, 164, or 167, is configured to short across a respective one of the active current limiting circuits 152 or 156 or one of the current sensing circuits 163 or 166. In some embodiments, each of the bypass circuits 162 and 166 includes an analog-to-digital converter configured to perform an analog-to-digital conversion operation as a technique for bypassing current sensing circuits 163 and 166, respectively. Similarly, an analog-to-digital converter may be configured to perform an analog-to-digital conversion operation as a technique for bypassing other sensing means, in some embodiments.

In some embodiments, each of the control signals 154, 157, 164, and 167 may represent a battery thermistor signal received from charger 102. In other words, the respective control signals 154, 157, 164, or 167 may be asserted or de-asserted to enable or disable the current control circuit dependent on a temperature measured at charger 102. In other embodiments, each of the control signals 154, 157, 164, and 167 may represent a control signal received from charger 102 indicating whether or not a charging operation is in progress. In other words, the respective control signals 154, 157, 164, and 167 may be asserted or de-asserted to enable or disable the current control circuit dependent on whether the battery cells within battery pack 120 are being charged or are discharging. As in the example illustrated in FIG. 1, in some embodiments, charger 102 may include a detection circuit 103 configured to detect when battery pack 120 is being charged and may assert or de-assert control signals 154, 157, 164, and 167 accordingly.

Figure 6:
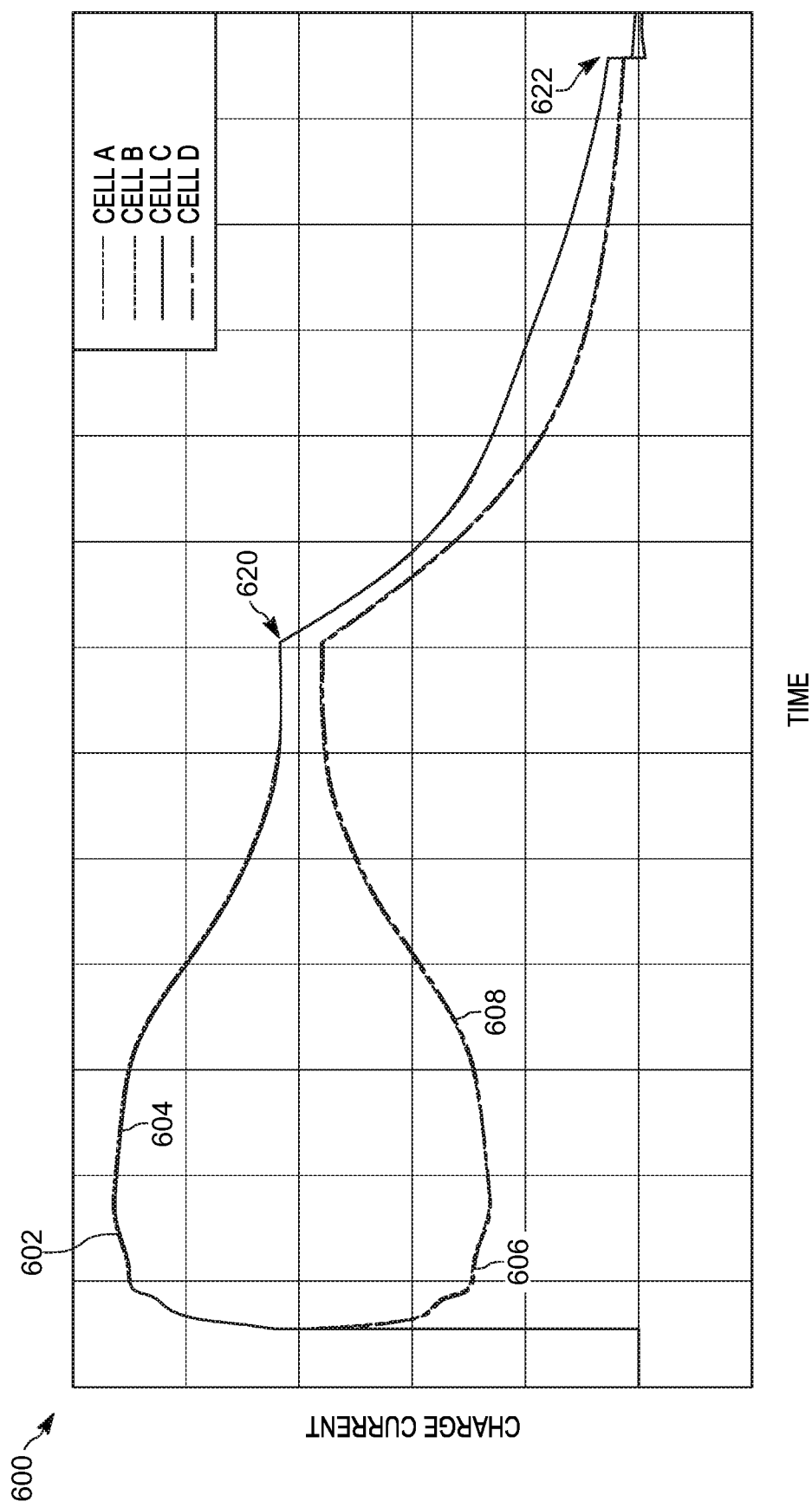
FIG. 6 is chart illustrating charge currents over time for a balanced battery pack containing cells of disparate types.

Referring now to FIG. 6, there is provided a chart 600 illustrating example charge currents over time for a balanced battery pack containing cells of disparate types. More specifically, chart 600 depicts test data illustrating how the techniques described herein for controlling charge current in a battery pack containing cells of disparate types affect the charge current in the cylindrical battery cells A (110) and C (114) of battery pack 320 illustrated in FIG. 3. Chart 600 depicts charge currents over time on a grid in which the space between pairs of vertical grid lines represents an interval of fifteen minutes.

As noted above, cylindrical battery cells A (110) and C (114) each have a charge current limit of 2.1 amps. In the illustrated example, battery pack 120 was charged at 2.9 amps with 55 mΩ resistors added to cylindrical battery cells A (110) and C (114) to better match the impedance of prismatic battery cells B (112) and D (116) and demonstrate an impedance-balanced battery pack. In this example, it was estimated that fast charging at 2.9 amps would limit the charge current in the cylindrical battery cells A (110) and C (114) to approximately 2.1 amps. Measured data indicated that, for cylindrical battery cells A (110) and C (114), the average full charge current was 2.25 amps. For example, the peak for the charge current in battery cell A (shown as charge current 602) and the peak for the charge current in battery cell C (shown as charge current 604) were measured as being with a range of 2.2 amps to 2.3 amps when the battery pack 320 was charged at 2.9 amps. This test data demonstrates that by adding an appropriate amount of impedance, the charge current can be optimized for battery cells of a particular type of lower impedance battery cell within a battery pack containing battery cells of disparate types.

In this example, the peak charge currents in prismatic battery cell B (shown as charge current 606) and prismatic battery cell D (shown as charge current 608) were measured as being less than 1.5 amps when the battery pack 320 was charged at 2.9 amps. The point of minimum charge current for the two prismatic battery cells, at almost 0.7 amps, was approximately twice that of the minimum charge current for the prismatic battery cells shown in the test data of chart 200 in FIG. 2 when the battery pack was unbalanced. In this example, the point labeled as 620 represents the crossover point at which the target maximum voltage for all battery cells has been reached. The point labeled as 622, which may be referred to as the "cutoff point," represents the point at which the charging of the battery pack, and all of the battery cells thereof, ceases.

The test data illustrated in FIGS. 2 and 6 illustrate that, in at least some embodiments, balancing the impedance of the battery cells in a battery pack during charging allows faster charge rates where charge current limits apply. An additional benefit of balancing the battery pack while charging was observed. That is, when charging the battery pack without balancing the impedances of cylindrical battery cells A (110) and C (114), the 2S2P battery pack became unbalanced. For example, the current in individual battery cells became unstable leading to oscillations during charging indicating that a series imbalance occurred. By adding impedance to cylindrical battery cells A (110) and C (114), the system was stabilized.

Figure 7:
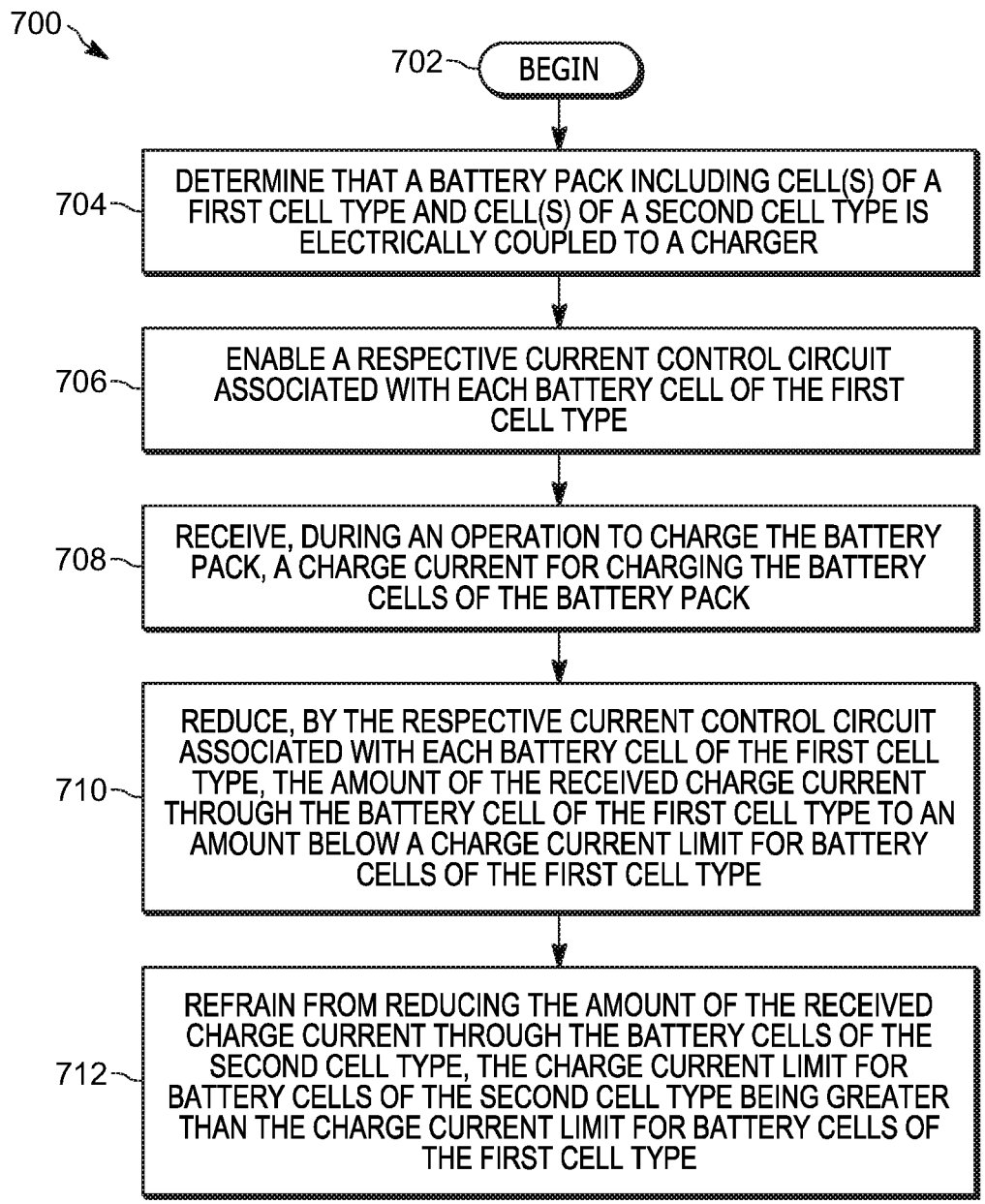
FIG. 7 is a flowchart illustrating selected elements of an example method for controlling charge current in a battery pack containing cells of disparate types, in accordance with some embodiments.

Referring now to FIG. 7, there is provided a flowchart illustrating selected elements of an example method 700 for controlling charge current in a battery pack containing cells of disparate types, in accordance with some embodiments. While a particular order of operations is indicated in FIG. 7 for illustrative purposes, the timing and ordering of such operations may vary where appropriate without negating the purpose and advantages of the examples set forth in detail throughout the remainder of this disclosure.

In this example embodiment, method 700 begins with block 702 in FIG. 7 and continues with block 704, where it is determined that a battery pack of a portable electronic device including one or more battery cells of a first cell type and one or more battery cells of a second cell type is electrically coupled to a charger. In one example, the battery pack includes two cylindrical cells in series that are in parallel with two prismatic cells in series, in accordance with a 2S2P topology. In some embodiments, determining that the battery pack is coupled to a charger may include receiving a control signal from the charger, as described above.

At block 706, the method includes, in response to determining that the battery pack is coupled to a charger, enabling a respective current control circuit associated with each battery cell of the first cell type. In at least some embodiments, the respective current control circuit may be electrically connected in series with each battery cell of the first cell type. The current control circuits may be any suitable type of current control circuits including, but not limited to, the current control circuits illustrated in FIGS. 3-5 and described herein.

At block 708, method 700 includes receiving, during an operation to charge the battery pack, a charge current for charging the battery cells of the battery pack.

At block 710, the method includes the respective current control circuit associated with each battery cell of the first cell type reducing the amount of the received charge current through the battery cell of the first cell type to an amount below a charge current limit for battery cells of the first cell type. For example, by adding impedance in series with the battery cells of the first cell type through the addition of a resistive element, DC/DC step-down converter, or active current limiting circuit, the amount of the received charge current through the battery cell may be reduced.

In at least some embodiments, the charge current limit for battery cells of the second cell type may be greater than the charge current limit for battery cells of the first cell type. In such embodiments, at block 712, the method includes refraining from reducing the amount of the received charge current through the battery cells of the second cell type.

Figure 8:
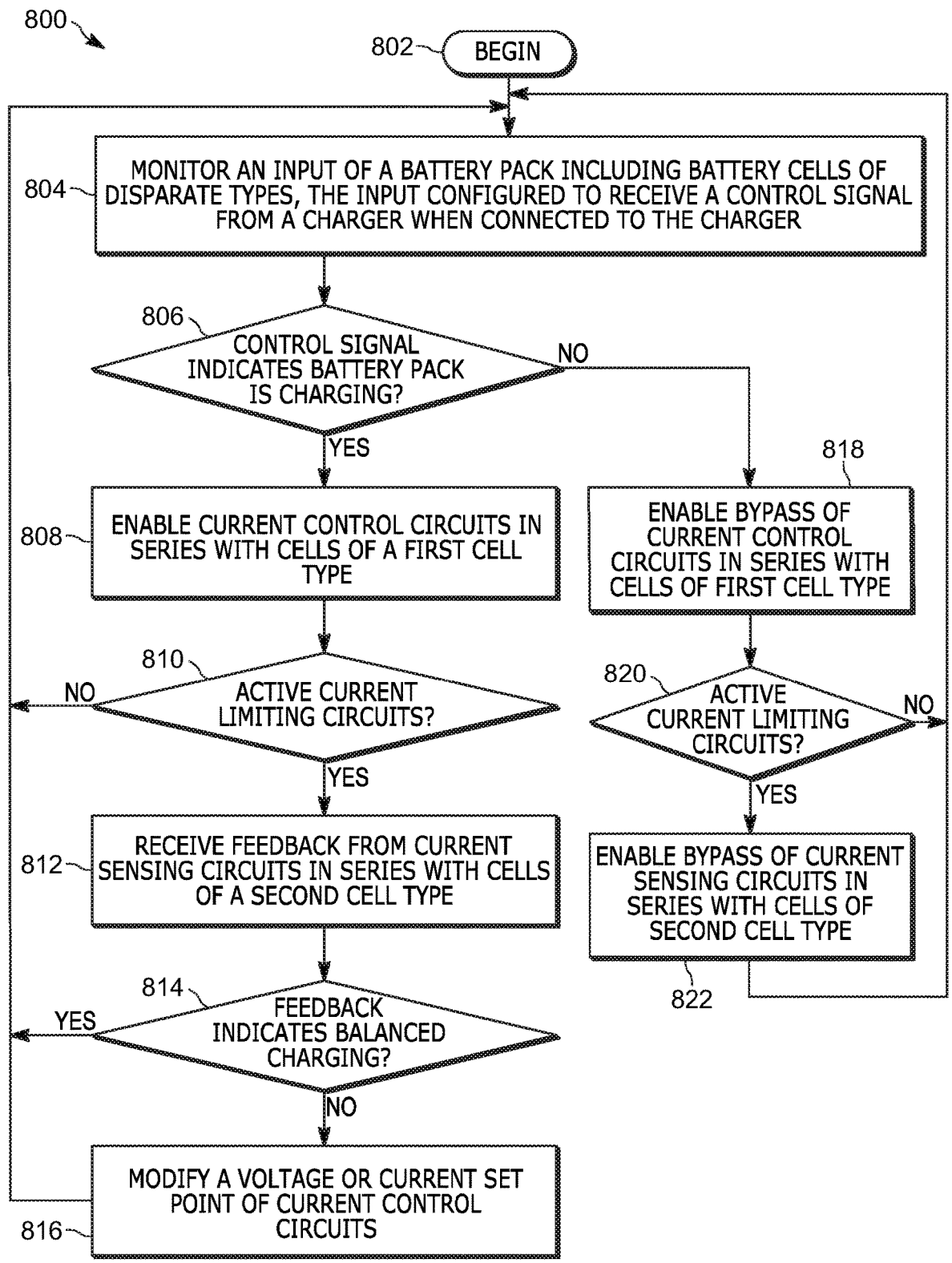
FIG. 8 is a flowchart illustrating selected elements of an example method for controlling charge current in a battery pack using current control circuits in series with particular battery cells, in accordance with some embodiments.

Referring now to FIG. 8, there is provided a flowchart illustrating selected elements of an example method 800 for controlling charge current in a battery pack using current control circuits in series with particular battery cells, in accordance with some embodiments. While a particular order of operations is indicated in FIG. 8 for illustrative purposes, the timing and ordering of such operations may vary where appropriate without negating the purpose and advantages of the examples set forth in detail throughout the remainder of this disclosure.

In the example embodiment illustrated in FIG. 8, method 800 begins with block 802 and continues with block 804, with monitoring an input of a battery pack of a battery-powered electronic device that includes battery cells of disparate types. The input may be configured to receive a control signal from a charger when the battery pack is connected to the charger If, at block 806, it is determined that the control signal indicates the battery pack is charging, method 800 may continue at 808. Otherwise, the method may proceed to 818. In some embodiments, the value of the control signal may be dependent on a temperature measured at the charger. In other embodiments, the control signal may be an output of a charging detection circuit configured to detect that the battery pack is connected to the charger or that the battery pack is being charged.

Method 800 includes, at 808, enabling respective current control circuits that are electrically coupled in series with each of the battery cells of a first cell type. In some embodiments, the battery cells of the first cell type may be cylindrical battery cells. Each of the current control circuits may include a resistive element, a DC/DC step-down converter, or an active current limiting circuit, in some embodiments.

If, at 810, the current control circuits in series with the battery cells of the first cell type are active current limiting circuits, method 800 may continue at 812. Otherwise, method 800 returns to 804. At 812, the method includes receiving feedback from respective current sensing circuits electrically coupled in series with each of the battery cells of a second cell type. In some embodiments, the battery cells of the second cell type may be prismatic battery cells.

If, at 814, the feedback received from the current sensing circuits indicates balanced charging across the battery cells of the battery pack, as described herein, method 800 may return to 804. Otherwise, the method may continue at 816. At 816, method 800 includes modifying a voltage or current set point of the current control circuits in an attempt to better balance the charging across the battery cells, after which the method returns to 804.

At 818, the method includes enabling the bypassing of the current control circuits in series with the battery cells of the first cell type. In some embodiments, this may include enabling respective bypass circuits electrically connected in parallel with the current control circuits, as described herein. Each of the bypass circuits may include a very low impedance MOSFET to short across a corresponding current control circuit.

If, at 820, the current control circuits in series with the battery cells of the first cell type are active current limiting circuits, method 800 may continue at 822. Otherwise, method 800 returns to 804. At 822, method 800 includes enabling the bypassing of current sensing circuits in series with cells of second cell type, after which the method returns to 804. In some embodiments, this may include enabling respective bypass circuits electrically connected in parallel with the current sensing circuits, as described herein. Each of the bypass circuits may include a very low impedance MOSFET to short across a corresponding current sensing circuit.

Figure 9:
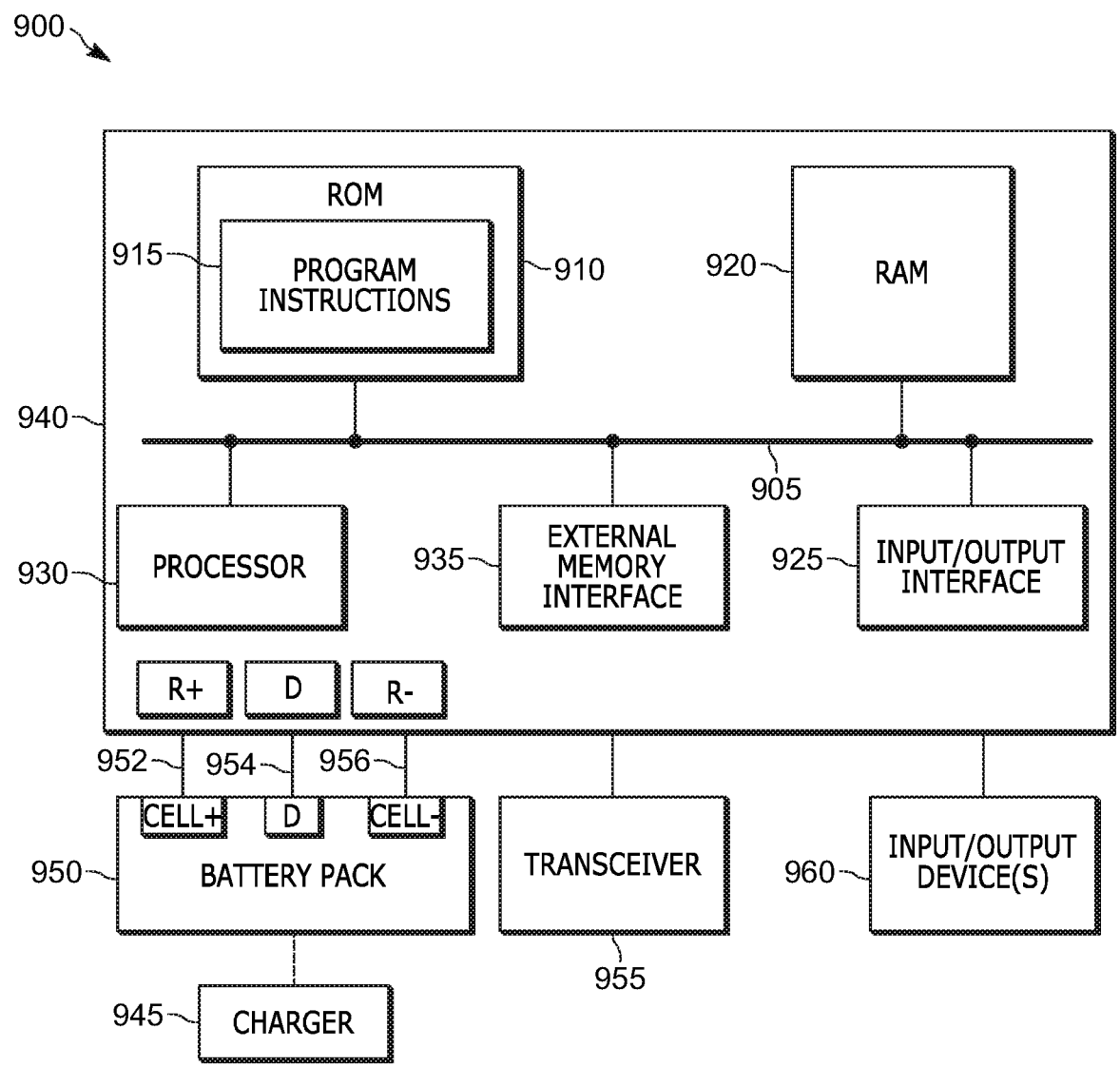
FIG. 9 is a block diagram illustrating selected elements of an example electronic device including a battery pack containing cells of disparate types and a host processing unit, in accordance with some embodiments.

Referring now to FIG. 9, there is provided a block diagram illustrating selected elements of an example electronic device 900 including a battery pack 950 containing battery cells of disparate types and a host processing unit, in accordance with some embodiments. Electronic device 900 may be any type of electronic device for which power can be supplied, at least at certain times, by battery pack 950. At certain times, battery pack 950 may be coupled to a charger 945 to charge the battery cells of battery pack 950, as described herein. Charger 945 may be similar to charger 102 illustrated in FIGS. 1, 3, 4, and 5, in some embodiments. In some embodiments, electronic device 900 may be a portable electronic device such as a multifunction radio, a mobile telephone, a laptop computer, a tablet computer, a smart phone, a lighting system, a sound system, or another type of portable electronic device.

Battery pack 950 may include circuitry or logic for controlling charge current in a battery pack containing cells of disparate types, as described herein. In various embodiments, battery pack 950 may be similar to battery pack 120 illustrated in FIG. 1, battery pack 320 illustrated in FIG. 3, battery pack 420 illustrated in FIG. 4, or battery pack 520 illustrated in FIG. 5, and may provide power to host processing unit 940 over a load path defined collectively by the paths 952 and 956 between the terminals (Cell+ and Cell−) of battery pack 950 and the terminals (R+ and R−) of host processing unit 940 as the load. Battery pack 950 may also send data to or receive data from host processing unit 940 over one or more data lines 954, in some embodiments. In some embodiments, a digital signal indicating a current or voltage measurement taken within battery pack 950 may be provided to processor 930 of host processing unit 940 over data lines 954. In response to receiving the digital signal, the processor 930 may take actions to address issues such as a discharge over-current or short circuit condition. In some embodiments, host processing unit 940 may be operable to perform power management tasks. For example, host processing unit 940 may be operable to reduce functionality or take other actions to prevent a battery protection circuit (such as safety circuit 118 illustrated in FIGS. 1, 3, 4, and 5) from tripping and disabling battery pack 120 (not shown).

In some embodiments, other operating parameters of battery pack 950 may be obtained or controlled by software operating on host processing unit 940. For example, host processing unit 940 may obtain one or more operating parameters of battery pack 950, or of particular battery cells thereof, over data lines 954. In some embodiments, the operating parameters of the battery pack, or of a particular battery cell, may be read from a memory within battery pack 950 that stores battery data by host processing unit 940 (not shown). The operating parameters of the battery pack or cell obtained by host processing unit 940 may include, but are not limited to, a state-of-charge of the battery pack or a battery cell thereof, one or more battery cell types, a battery pack or battery cell topology, the available capacity of the battery pack or a battery cell thereof, a peak charging capacity of the battery pack or a battery cell thereof, a present charging capacity of the battery pack or a battery cell thereof, a nominal voltage range for the battery pack or a battery cell thereof, the temperature of the battery pack or a battery cell thereof, an indication of the age of the battery pack or a battery cell thereof, the number of charge-discharge cycles the battery pack or battery cell has experienced, or a measure of impedance for the battery pack or a battery cell thereof. In some embodiments, a power management function operating on the host processing unit 940 may be able to read these or other values from the memory.

As illustrated in this example embodiment, host processing unit 940 may include a Read Only Memory (ROM) 910, a Random Access Memory (RAM) 920, an electronic processor 930, an input/output interface 925, and an external memory interface 935, all of which are coupled to a system bus 905 through which they communicate with each other. In various embodiments, electronic processor 930 may include a microprocessor, a microcontroller, a system-on-chip, a field-programmable gate array, a programmable mixed-signal array or, in general, any system or sub-system that includes nominal memory and that is capable of executing a sequence of instructions in order to control hardware elements of electronic device 900.

In this example embodiment, ROM 910 stores program instructions 915, at least some of which may be executed by electronic processor 930 to perform the methods described herein. For example, some of the operations of method 700 illustrated in FIG. 7 or method 800 illustrated in FIG. 8 may be performed by program instructions executing on host processing unit 940. In some embodiments, program instructions 915 may include program instructions that when executed on host processing unit 940 implement other functionality features of electronic device 900. In some embodiments, program instructions 915 may be stored in another type of non-volatile memory, such as a hard disk, a CD-ROM, an optical storage device, a magnetic storage device, a PROM (Programmable Read Only Memory), an EPROM (Erasable Programmable Read Only Memory), an EEPROM (Electrically Erasable Programmable Read Only Memory) or a Flash memory. In this example embodiment, RAM 920 may, from time to time, store data representing battery data or operating parameters of battery pack 950, or of particular battery cells thereof, to be used in controlling charge current in battery pack 950, as described herein, or in performing other power management functions on behalf of electronic device 900. In some embodiments, RAM 920 may also store data used in performing other functions of the electronic device 900.

In this example embodiment, input/output interface 925 may include one or more analog input interfaces, such as one or more A/D convertors, or digital interfaces for receiving signals or data representing battery data or operating parameters of battery pack 950 or of particular battery cells thereof. Input/output interface 925 may also include interfaces through which host processing unit 940 may be coupled to other elements of electronic device 900. For example, host processing unit 940 may be coupled to input/output devices that implement other functionality features of electronic device 900, such as a keyboard, a mouse, a touch panel, a switch, a microphone, a video camera, a display, a speaker, one or more sensors, and the like over input/output interface 925. In the illustrated example, host processing unit 940 is shown coupled to a transceiver 955 and one or more input/output devices 960.

External memory interface 935 may include one or more interfaces through which host processing unit 940 may be coupled to an external memory (not shown in FIG. 9). Such an external memory may include, for example, a hard-disk drive (HDD), an optical disk drive such as a compact disk (CD) drive or digital versatile disk (DVD) drive, a solid state drive (SSD), a tape drive, a flash memory drive, or a tape drive, to name a few.

The methods and apparatus described herein provide significant technical advantages over existing battery packs. For example, the methods and apparatus described herein for impedance-balancing and controlling charge current in battery packs containing cells of disparate types may allow such battery packs to be used to power portable electronic devices in which the charge current must be limited for particular types of battery cells. The battery cells in the battery pack may have different sizes, shapes, energy capacities, impedances, or battery chemistries, but may have similar voltage profiles.

By adding current control mechanisms into a battery pack containing cells of different types and configurations, the charging current for each cell type may be optimized. For example, impedance may be selectively added into the battery pack in order to control the current into particular battery cells and achieve an impedance-balanced battery pack during charging. This enables the use of different cell types and chemistries and allows the fastest charge rate possible while charging all battery cells at the same time. The added impedance may be bypassed during discharging in order to optimize the energy delivered to a portable electronic device or other load. This ability to implement a bypass feature for discharging in conjunction with added impedance to balance the charging of battery cells of disparate types provides technical benefits over existing devices that require as low a discharge impedance as possible to meet goals for efficiency and peak current performance. In some embodiments, a DC/DC step-down converter, such as a buck regulator, or an active current limiting circuit may be selectively added to the battery pack to control the current into particular cells in the battery pack during charging.

While several example embodiments described herein include a battery pack having a 2S2P configuration, in other embodiments battery cells of disparate cells types may be arranged differently within a battery pack. For example, a battery pack containing battery cells of disparate cell types may have a one-series-two-parallel (1S2P) configuration in which one battery cell of each of two cell types are arranged in parallel with each other. In another example, a battery pack may include battery cells in a 3S type configuration, such as a 3 S2P configuration. In these and other embodiments, the methods and apparatus described herein for impedance-balancing and controlling charge current in battery packs containing cells of disparate types may allow such battery packs to be used to power portable electronic devices in which the charge current must be limited for particular types of battery cells.

While several example embodiments described herein include battery packs containing battery cells of different cell types that have the same battery chemistry, e.g., a Li-Ion chemistry, in other embodiments the disclosed techniques for impedance-balancing and controlling charge current in battery packs containing cells of disparate types may be applied to battery packs in which the battery cells have different battery chemistries but similar voltage profiles.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element preceded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized electronic processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer-readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and integrated circuits (ICs) with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of any single disclosed embodiment. Thus, the following claims are hereby incorporated into the Detailed Description, with each claim standing on its own as a separately claimed subject matter.

We claim:

1. A battery pack for an electronic device, comprising:
one or more battery cells of a first cell type electrically connected between positive and negative terminals of the battery pack, each battery cell of the first cell type having a first impedance and a first charge current limit;
one or more battery cells of a second cell type electrically connected between the positive and negative terminals of the battery pack in parallel with the one or more battery cells of the first cell type, each battery cell of the second cell type having a second impedance greater than the first impedance and a second charge current limit greater than the first charge current limit; and
a respective current control circuit electrically connected in series with each of the one or more battery cells of the first cell type and configured to, during an operation to charge the one or more battery cells of the first cell type and the one or more battery cells of the second cell type at the same time, reduce a charge current through the battery cell of the first cell type below the first charge current limit.

2. The battery pack of claim 1, wherein the one or more battery cells of the first cell type and the one or more battery cells of the second cell type have substantially similar charge voltages.

3. The battery pack of claim 1, wherein the one or more battery cells of the first cell type are of a different shape or size than the one or more battery cells of the second cell type.

4. The battery pack of claim 1, wherein each of the one or more battery cells of the first cell type has a first energy capacity and each of the one or more battery cells of the second cell type has a second energy capacity less than the first energy capacity.

5. The battery pack of claim 1, wherein the respective current control circuit electrically connected in series with each of the one or more battery cells of the first cell type comprises a resistive element.

6. The battery pack of claim 1, wherein the respective current control circuit electrically connected in series with each of the one or more battery cells of the first cell type comprises a direct-current-to-direct-current step-down converter.

7. The battery pack of claim 1, further comprising a respective current sensing circuit electrically connected in series with each of the one or more battery cells of the second cell type and configured to provide feedback to a respective one of the current control circuits;
wherein the respective current control circuit electrically connected in series with each of the one or more battery cells of the first cell type comprises an active current limiting device configured to receive feedback from a respective one of the current sensing circuits.

8. The battery pack of claim 1, further comprising a respective bypass circuit electrically connected in parallel with each of the current control circuits and configured to disable the current control circuit during battery discharge cycles.

9. A method for controlling charge current in a battery pack, comprising:
receiving, during an operation to charge the battery pack, a charge current for charging a plurality of battery cells in the battery pack, the plurality of battery cells including:
one or more battery cells of a first cell type, each battery cell of the first cell type having a first impedance and a first charge current limit; and
one or more battery cells of a second cell type, each battery cell of the second cell type having a second impedance greater than the first impedance and a second charge current limit greater than the first charge current limit; and
charging the one or more battery cells of the first cell type and the one or more battery cells of the second cell type at the same time, the charging including reducing, by a respective current control circuit associated with each of the one or more battery cells of the first cell type, the amount of the received charge current through the battery cell of the first cell type to an amount less than the first charge current limit.

10. The method of claim 9, wherein the one or more battery cells of the first cell type and the one or more battery cells of the second cell type have substantially similar charge voltages.

11. The method of claim 9, wherein each of the one or more battery cells of the first cell type has a first energy capacity and each of the one or more battery cells of the second cell type has a second energy capacity less than the first energy capacity.

12. The method of claim 9, wherein the respective current control circuit associated with each of the one or more battery cells of the first cell type comprises a resistive element connected in series with the battery cell of the first cell type or a direct-current-to-direct-current step-down converter connected in series with the battery cell of the first cell type.

13. The method of claim 9, wherein:
the respective current control circuit electrically connected in series with each of the one or more battery cells of the first cell type comprises an active current limiting device; and
the method further comprises receiving, by each of the active current limiting devices, feedback from a respective current sensing circuit electrically connected in series with the one or more battery cells of the second cell type.

14. The method of claim 9, further comprising:
determining that the battery pack is electrically coupled to a charger; and
enabling the respective current control circuit electrically connected in series with each of the one or more battery cells of the first cell type in response to determining that the battery pack is electrically coupled to the charger.

15. The method of claim 14, further comprising:
determining that the battery pack has been decoupled from the charger; and
disabling the respective current control circuit electrically connected in series with each of the one or more battery cells of the first cell type in response to determining that the battery pack has been decoupled from the charger.

16. A portable electronic device, comprising:
a battery pack; and
one or more electrical circuits powered by the battery pack;
wherein the battery pack comprises:
one or more battery cells of a first cell type electrically connected between positive and negative terminals of the battery pack, each battery cell of the first cell type having a first impedance and a first charge current limit;
one or more battery cells of a second cell type electrically connected between the positive and negative terminals of the battery pack in parallel with the one or more battery cells of the first cell type, each battery cell of the second cell type having a second impedance greater than the first impedance and a second charge current limit greater than the first charge current limit; and
a respective current control circuit electrically connected in series with each of the one or more battery cells of the first cell type and configured to, during an operation to charge the one or more battery cells of the first cell type and the one or more battery cells of the second cell type at the same time, reduce a charge current through the battery cell of the first cell type below the first charge current limit.

17. The portable electronic device of claim 16, wherein the respective current control circuit electrically connected in series with each of the one or more battery cells of the first cell type comprises a resistive element.

18. The portable electronic device of claim 16, wherein the respective current control circuit electrically connected in series with each of the one or more battery cells of the first cell type comprises a direct-current-to-direct-current step-down converter.

19. The portable electronic device of claim 16, wherein:
the battery pack further comprises a respective current sensing circuit electrically connected in series with each of the one or more battery cells of the second cell type and configured to provide feedback to a respective one of the current control circuits; and
the respective current control circuit electrically connected in series with each of the one or more battery cells of the first cell type comprises an active current limiting device configured to receive feedback from a respective one of the current sensing circuits.

20. The portable electronic device of claim 16, wherein the battery pack further comprises a respective bypass circuit electrically connected in parallel with each of the current control circuits and configured to disable the current control circuit during battery discharge cycles.

\* \* \* \* \*